(12) United States Patent
Nozawa

(10) Patent No.: US 8,354,205 B2
(45) Date of Patent: Jan. 15, 2013

(54) MASK BLANK, TRANSFER MASK, AND METHODS OF MANUFACTURING THE SAME

(75) Inventor: Osamu Nozawa, Tokyo (JP)

(73) Assignee: Hoya Corporation, Tokyo (JP)

( * ) Notice: Subject to any disclaimer, the term of this patent is extended or adjusted under 35 U.S.C. 154(b) by 179 days.

(21) Appl. No.: 12/862,405

(22) Filed: Aug. 24, 2010

(65) Prior Publication Data

US 2011/0053057 A1 Mar. 3, 2011

(30) Foreign Application Priority Data

Aug. 25, 2009 (JP) ................................. 2009-194701
Sep. 9, 2009 (JP) ................................. 2009-207736

(51) Int. Cl.
*G03F 1/46* (2012.01)
*G03F 1/50* (2012.01)
*G03F 1/58* (2012.01)

(52) U.S. Cl. .............................................. 430/4; 430/5

(58) Field of Classification Search .................. 430/4–5; 216/12

See application file for complete search history.

(56) References Cited

U.S. PATENT DOCUMENTS

| 5,920,244 A * | 7/1999 | Kobayashi et al. ........... 333/219 |
| 5,995,127 A * | 11/1999 | Uzuka .......................... 347/204 |
| 2005/0208389 A1 * | 9/2005 | Ishibashi et al. .................. 430/5 |
| 2009/0226826 A1 | 9/2009 | Nozawa |

FOREIGN PATENT DOCUMENTS

KR 2007114025 A * 11/2007

OTHER PUBLICATIONS

Translation of Nam et al. KR-10-2007-114025 A published Nov. 29, 2007 (pp. 1-29).*

* cited by examiner

*Primary Examiner* — Mark F Huff
*Assistant Examiner* — John S Ruggles
(74) *Attorney, Agent, or Firm* — Sughrue Mion, PLLC

(57) ABSTRACT

A mask blank for producing a transfer mask adapted to ArF excimer laser exposure light. The mask blank has a light-shielding film on a transparent substrate. The light-shielding film has a structure in which a light-shielding layer and a front-surface antireflection layer are laminated in this order from the transparent substrate. The light-shielding layer is made of a material containing tantalum and nitrogen. The front-surface antireflection layer is made of material containing tantalum and silicon and further containing one or more elements selected from oxygen and nitrogen.

14 Claims, 4 Drawing Sheets

N=0
Rq=0.59(nm)

N=7(at%)
Rq=0.50(nm)

N=32(at%)
Rq=0.25(nm)

N=62(at%)
Rq=1.46(nm)

MASK BLANK, TRANSFER MASK, AND METHODS OF MANUFACTURING THE SAME

This application is based upon and claims the benefit of priority from Japanese Patent Application No. 2009-194701, filed on Aug. 25, 2009, and Japanese Patent Application No. 2009-207736, filed on Sep. 9, 2009, the disclosures of which are incorporated herein in their entirety by reference.

TECHNICAL FIELD

This invention relates to a transfer mask for use in, for example, transferring a fine pattern in the manufacture of a semiconductor device and to a mask blank as an intermediate product that can be formed into the transfer mask by applying certain treatments thereto, and further relates to methods of manufacturing them.

BACKGROUND ART

In the manufacture of a semiconductor device or the like, a fine pattern is formed by photolithography and, in a fine pattern transfer process where the photolithography is performed, a transfer mask is used. In general, the transfer mask is obtained by forming a desired fine transfer pattern in a light-shielding film of a mask blank as an intermediate product in which the light-shielding film is formed on a glass substrate. Therefore, the properties of the light-shielding film of the mask blank as the intermediate product almost exactly determine the performance of the obtained transfer mask. Conventionally, a material composed mainly of chromium (Cr) has been widely used as a material of the light-shielding film. Following the miniaturization of transfer patterns, the wavelength of exposure light for use has been shortened to KrF excimer laser light (wavelength: about 248 nm) and further to ArF excimer laser light (wavelength: about 193 nm), but it is becoming difficult to further shorten the exposure light wavelength in the transmission photolithography. Nevertheless, the miniaturization of transfer patterns has advanced to DRAM hp45 nm and further to DRAM hp32 nm so that the pattern pitch (about 190 nm in hp45 nm generation) of transfer masks has become shorter than the wavelength of ArF exposure light, thus resulting in a strict requirement for the accuracy of the transfer patterns.

With higher integration of semiconductor devices, fine patterns exceeding the transfer limit of the conventional photolithography have been required. In view of this, the extreme ultraviolet (EUV) lithography using EUV light with a shorter wavelength is expected to be promising. Since the EUV light has an extremely short wavelength of about 0.2 to 100 nm, a reflective mask disclosed in JP-A-2002-246299 (Patent Document 1), for example, is used as a transfer mask for transferring a fine pattern. This reflective mask has a multilayer reflective film formed on a substrate and adapted to reflect EUV exposure light and a buffer layer of silicon oxide formed on the multilayer reflective film and further has an absorbent film formed in a pattern on the buffer layer and adapted to absorb the exposure light. The absorbent film is made of materials composed mainly of tantalum. Specifically, in order to suppress the reflectance for inspection light with a wavelength of 150 nm to 300 nm, the absorbent film has a two-layer structure comprising a lower layer of Ta or TaN and a surface layer of TaO.

On the other hand, as described in JP-A-2008-268980 (Patent Document 2), a reduction in thickness of a resist is becoming important for forming a pattern in a light-shielding film by dry etching in a mask blank for ArF exposure. In the case of a conventional light-shielding film made of a material composed mainly of chromium, a chlorine-based gas containing oxygen is used as an etching gas in dry etching for forming a transfer pattern in the light-shielding film using a resist pattern as a mask. However, the resist is poor in resistance to oxygen plasma and thus is significantly reduced in amount during dry etching of the light-shielding film and, therefore, the reduction in thickness of the resist is not easily achieved. In view of this, in order to achieve the reduction in thickness of the resist, Patent Document 2 proposes a method of manufacturing a mask by processing a mask blank in which an antireflection layer in the form of a metal compound film that is not substantially etchable by oxygen-free chlorine-based (Cl-based) dry etching but is etchable by at least one of oxygen-containing chlorine-based ((Cl+O)-based) dry etching and fluorine-based (F-based) dry etching is laminated on a light-shielding layer in the form of a metal film that is not substantially etchable by oxygen-containing chlorine-based ((Cl+O)-based) dry etching but is etchable by oxygen-free chlorine-based (Cl-based) dry etching and by fluorine-based (F-based) dry etching. This method comprises a first step of patterning the antireflection layer by F-based dry etching using a resist mask (resist pattern) pattern-formed on a main surface of the antireflection layer and a second step of patterning the light-shielding layer by Cl-based dry etching using the patterned antireflection layer as a hard mask. In Patent Document 2, tantalum (Ta) is cited as a metal applicable to the metal film forming the light-shielding layer.

JP-A-2001-174973 (Patent Document 3) discloses a halftone phase shift mask comprising a halftone phase shift film containing a tantalum silicide-based material. Specifically, the halftone phase shift film has a two-layer structure comprising a first layer formed of metal tantalum and a second layer formed of an oxide of tantalum silicide. The second layer is formed by DC magnetron sputtering using a mixed target of tantalum and silicon and using a sputtering gas containing oxygen. When forming a transfer pattern in the halftone phase shift film, the first and second layers are continuously dry-etched using a $CF_4$ gas as an etching gas.

SUMMARY OF THE INVENTION

However, tantalum is a material that is etchable by Cl-based dry etching using an oxygen-substantially-free chlorine-based (Cl-based) gas and by F-based dry etching using a fluorine-based (F-based) gas, but is also a material that is easily oxidized in an oxygen-containing atmosphere, while, oxidized tantalum is a material that is not substantially etchable by Cl-based dry etching. Therefore, by simply forming a TaO/Ta-based light-shielding film having a laminated structure of a light-shielding layer composed mainly of tantalum and a front-surface antireflection layer composed mainly of tantalum oxide, it is difficult to ensure sufficient etching selectivity between the light-shielding layer and the front-surface antireflection layer with respect to Cl-based dry etching and thus it is not easy for the front-surface antireflection layer to serve as an etching mask.

Further, the etching selectivity between tantalum oxide and non-oxidized tantalum with respect to Cl-based dry etching is not so significant as that in the case of MoSiON or SiON that is conventionally used as a material of an etching mask. If the front-surface antireflection layer can be stripped like a normal etching mask film after dry-etching the light-shielding layer, the above-mentioned etching selectivity between tantalum oxide and non-oxidized tantalum may not raise a problem. However, since it should also serve as a front-surface antireflection layer, there may arise a problem that the front-surface antireflection layer is damaged during Cl-based dry etching of the light-shielding layer so that its pattern edge portion is rounded, resulting in a degradation of the line edge roughness (LER) or its optical properties are affected, resulting in a change of the front-surface reflectance for exposure light.

In an ArF-exposure mask of the transmission lithography, as different from an EUV-exposure reflective mask of the reflective lithography, it is necessary not only to control the reflectance for exposure light on the front-surface side of a light-shielding film (absorbent film) to a predetermined value (e.g. 30% or less), but also to simultaneously control the reflectance for exposure light on the substrate side (back-surface side) of the light-shielding film to a predetermined value (e.g. less than 40%). This is because if the front-surface reflectance or the back-surface reflectance is large, unwanted reflected light (flare, ghost, etc.) may occur during exposure. That is, a light-shielding layer of the light-shielding film should also have a back-surface antireflection function which, however, cannot be achieved if the light-shielding layer is simply made of a material composed mainly of Ta.

Further, with a front-surface antireflection layer composed mainly of tantalum oxide, the front-surface reflectance for ArF exposure light can only be controlled to around 20%, which is the optical limit. It is difficult to control the front-surface reflectance to 15% or less or 10% or less.

In DC magnetron sputtering, a sputtering target is required to have a certain or higher electrical conductivity. Accordingly, when forming a film composed mainly of TaSiO, the film formation is carried out by using a mixed target of highly conductive tantalum metal and silicon and causing a sputtering gas containing oxygen, such as a mixed gas of oxygen and argon, to collide with the target so that oxygen of the sputtering gas reacts with tantalum and silicon of the target (reactive DC sputtering). This also applies to the case of forming an oxide, nitride, or oxynitride film of a transition metal other than tantalum and silicon. However, when the difference in affinity for oxygen (nitrogen) is large between a transition metal and silicon, a phenomenon occurs in which atoms with a higher affinity are selectively oxidized (nitrified). When this phenomenon occurs, the sputtering rate of the oxidized (nitrided) substance on a target surface is selectively reduced so that it is difficult to provide a uniform composition in a formed film from its bottom to top. Particularly when the transition metal is selectively oxidized (nitrided), the conductivity of the target surface is reduced, thus resulting in unstable film formation. Further, the oxidized (nitrided) transition metal adhering to the target surface causes abnormal discharge so that particles are produced. In particular, since tantalum has the property of being easily oxidized in the atmosphere, this problem is significant.

This invention has been made under these circumstances and has an object to provide, in the transmission lithography using ArF exposure light, a mask blank having a reduced front-surface reflectance and a reduced back-surface reflectance and adaptable to further miniaturization, and further to provide a transfer mask manufactured from such a mask blank and a method of manufacturing such a transfer mask. Further, this invention has an object to provide a method of manufacturing a mask blank comprising a film with a low defect density and with a uniform composition containing tantalum and silicon and further containing oxygen and/or nitrogen.

In order to achieve the above-mentioned objects, this invention has the following structures.

(Structure 1)

A mask blank for producing a transfer mask adapted to ArF excimer laser exposure light, comprising:

a transparent substrate, and a light-shielding film on the transparent substrate, wherein the light-shielding film has a structure in which a light-shielding layer and a front-surface antireflection layer are laminated in this order from the transparent substrate side, the light-shielding layer is made of a material containing tantalum and nitrogen, and the front-surface antireflection layer is made of a material containing tantalum and silicon and further containing one or more elements selected from oxygen and nitrogen.

(Structure 2)

The mask blank according to Structure 1, wherein a content of nitrogen in the light-shielding layer is less than 62 at %.

(Structure 3)

The mask blank according to Structure 1 or 2, wherein a content of nitrogen in the light-shielding layer is 7 at % or more.

(Structure 4)

The mask blank according to any one of Structures 1 to 3, wherein the light-shielding film has a thickness of less than 65 nm.

(Structure 5)

The mask blank according to any one of Structures 1 to 4, wherein the front-surface antireflection layer has a thickness of 5 nm or more and 20 nm or less.

(Structure 6)

The mask blank according to any one of Structures 1 to 5, wherein the light-shielding layer or the front-surface antireflection layer contains boron.

(Structure 7)

A method of manufacturing the mask blank according to any one of Structures 1 to 6, comprising:

depositing the front-surface antireflection layer by high-frequency sputtering using a mixed sintered target containing one or more substances selected from tantalum oxide and tantalum nitride and one or more substances selected from silicon oxide and silicon nitride.

(Structure 8)

The method according to Structure 7, wherein the mixed sintered target contains one or more substances selected from $Ta_2O_5$ and TaN and one or more substances selected from $SiO_2$ and $Si_3N_4$.

(Structure 9)

The method according to Structure 7, wherein the mixed sintered target comprises $Ta_2O_5$ and $SiO_2$ and a mol % mixing ratio of $Ta_2O_5$ and $SiO_2$ is 10:90 to 90:10.

(Structure 10)

A transfer mask wherein a transfer pattern is formed on the light-shielding film of the mask blank according to any one of Structures 1 to 6.

(Structure 11)

A method of manufacturing a transfer mask in which a transfer pattern is formed on the light-shielding film of the mask blank according to any one of Structures 1 to 6, comprising:

a first step of dry-etching the front-surface antireflection layer with a fluorine-based gas substantially free of oxygen using, as an etching mask, a resist film having the transfer pattern; and a second step of, after the first step, dry-etching the light-shielding layer with a chlorine-based gas substantially free of oxygen using the front-surface antireflection layer as an etching mask.

According to this invention, a light-shielding film has a laminated structure of a light-shielding layer and a front-surface antireflection layer formed in this order from the substrate side, wherein the front-surface antireflection layer is made of a material containing tantalum and silicon and further containing one or more elements selected from oxygen and nitrogen. This makes it possible to enhance the etching resistance to Cl-based dry etching. Further, since the light-shielding layer is made of a material containing tantalum and nitrogen, oxidation of tantalum is suppressed by nitrogen so that the etching rate in Cl-based dry etching can be made high. Since the etching time for Cl-based dry etching of the light-shielding layer can be shortened, the time of exposure of the front-surface antireflection layer to a Cl-based gas is shortened. Based on their synergy effect, it is possible to significantly suppress damage to the front-surface antireflection layer during Cl-based dry etching of the light-shielding layer and thus it is possible to suppress a reduction in LER of a pattern edge portion and a change in front-surface reflectance.

Further, since the function of the front-surface antireflection layer as an etching mask for the light-shielding layer is enhanced, a resist film to be formed thereon is only required to have a minimal thickness for forming a transfer pattern in the front-surface antireflection layer by F-based dry etching.

Further, it is also possible to control the front-surface reflectance for ArF exposure light to 15% or less or 10% or less.

Further, by setting the nitrogen content of the light-shielding layer to 7 at % or more, the back-surface reflectance for ArF exposure light can be set to less than 40%.

DETAILED DESCRIPTION OF THE INVENTION

Figure 1:
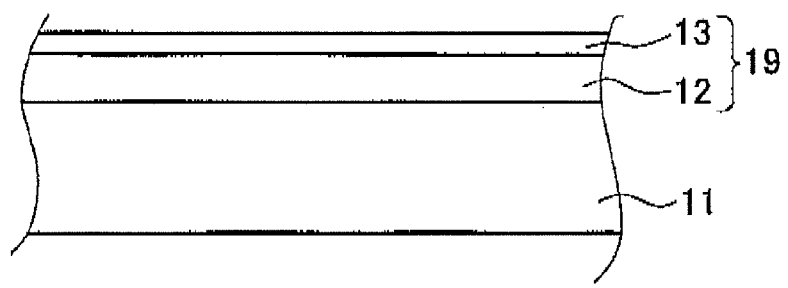
FIG. 1 is a schematic sectional view showing the structure of a mask blank according to an embodiment of this invention.
Figure 2:
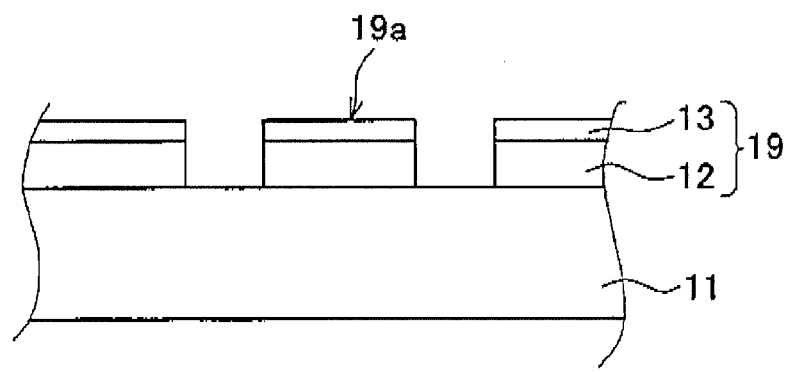
FIG. 2 is a schematic sectional view showing the structure of a transfer mask according to the embodiment of this invention.

Hereinbelow, an embodiment of this invention will be described with reference to the drawings. FIG. 1 is a sectional view showing the structure of a mask blank according to the embodiment of this invention. FIG. 2 is a sectional view showing the structure of a transfer mask according to the embodiment of this invention. FIGS. 3A to 3G are sectional views showing the process of manufacturing the transfer mask from the mask blank.

As shown in FIG. 1, the mask blank according to this embodiment comprises a transparent substrate 11 which, for example, is made of synthetic quartz and has an about 152 mm 152 mm square size with a thickness of about 6.35 mm, and a light-shielding film 19 stacked on the substrate 11. The light-shielding film 19 comprises a light-shielding layer 12 and a front-surface antireflection layer 13 which are formed in this order. The light-shielding layer 12 contains Ta and N, while the front-surface antireflection layer 13 contains Ta and Si and further contains one or more elements selected from O and N.

As shown in FIG. 2, the transfer mask according to this embodiment is configured such that a transfer pattern 19a is formed in the light-shielding film 19. The transfer pattern 19a of the light-shielding film 19 can be obtained by the known photolithography. Specifically, a resist film is formed and patterned on the light-shielding film 19 and, using the patterned resist film as a mask, the transfer pattern 19a is formed in the light-shielding film 19 by dry etching.

The light-shielding layer 12 largely contributes to the optical density of the entire light-shielding film 19. The front-surface antireflection layer 13 is provided so that the light-shielding film 19 can suppress further reflection of a part of exposure light reflected by lenses of a reduction optical system in an exposure apparatus and, therefore, the front-surface antireflection layer 13 is adjusted to allow transmission of the exposure light to some degree. This makes it possible to suppress total reflection on a surface of the light-shielding film 19 and thus to attenuate the exposure light using the interference effect or the like. Since the front-surface antireflection layer 13 is designed to have such a predetermined transmittance, its contribution to the optical density of the entire light-shielding film 19 is small. The optical density of the entire light-shielding film 19 is required to be at least 2.5 or more and, on a standard basis, 2.8 or more and is preferably 3.0 or more for adaptation even to an exposure apparatus with no correction function.

Preferably, the light-shielding layer 12 does not contain Si. Si is easily etched by F-based dry etching, but is not easily etched by Cl-based dry etching. The front-surface antireflection layer 13 is made of the material that is easily etched by F-based dry etching and, therefore, in order to allow the front-surface antireflection layer 13 to serve as an etching mask, the material of the light-shielding layer 12 should have sufficient etching selectivity between itself and that of the front-surface antireflection layer 13 with respect to F-based dry etching. On the other hand, the material, such as synthetic quartz, of the transparent substrate 11 is easily etched by F-based dry etching, but is not easily etched by Cl-based dry etching. Further, Ta is higher than Si in the light-shielding performance for ArF exposure light. Taking them into account, the light-shielding layer 12 should be made of a material that is easily etched by Cl-based dry etching, and thus preferably does not contain Si. Even if Si is contained, the Si content is required to be 10 at % or less and is preferably 5 at % or less.

As described before, Ta being the main component of the light-shielding layer 12 is a material that is easily oxidized in an oxygen-containing atmosphere, but the oxidation can be suppressed if nitrogen (N) is contained. In order to ensure the etching rate of the light-shielding layer 12 in Cl-based dry etching, it is necessary that nitrogen be contained in the light-shielding layer 12.

Figure 4:
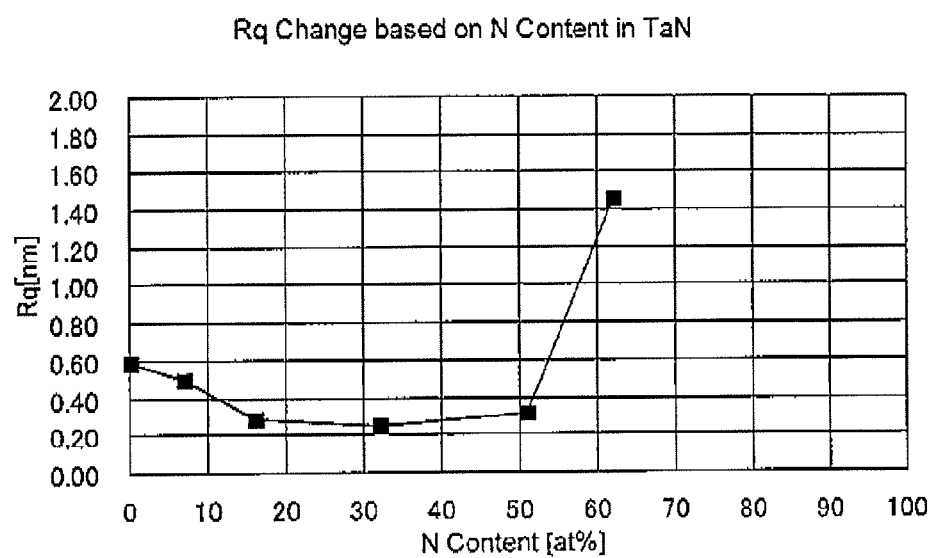
FIG. 4 is a graph showing the relationship between the nitrogen content of a film formed of TaN and the surface roughness thereof.
Figure 5A:
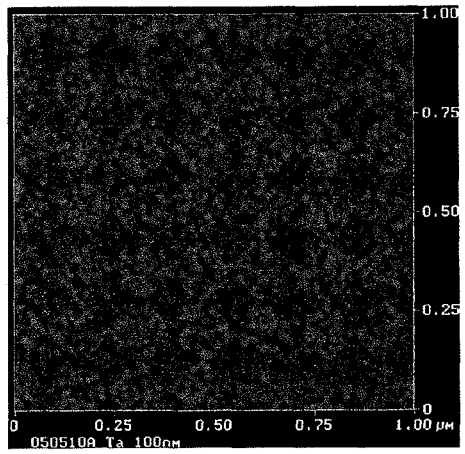
FIGS. 5A to 5D are AFM images of surfaces of films formed of tantalum nitrides (TaN) with different nitrogen contents.
Figure 5B:
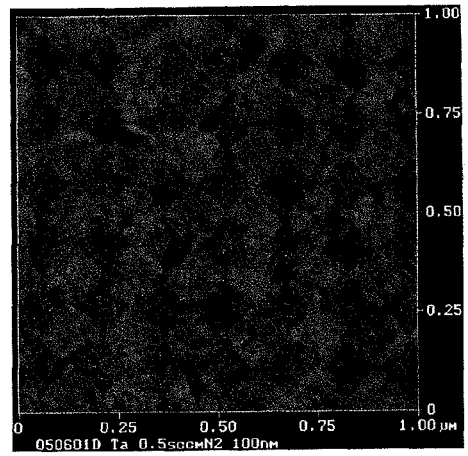
Figure 5C:
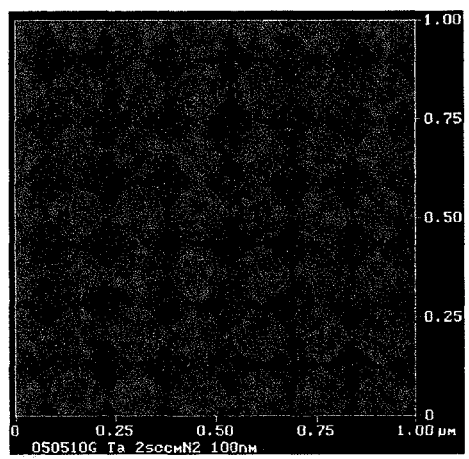
Figure 5D:
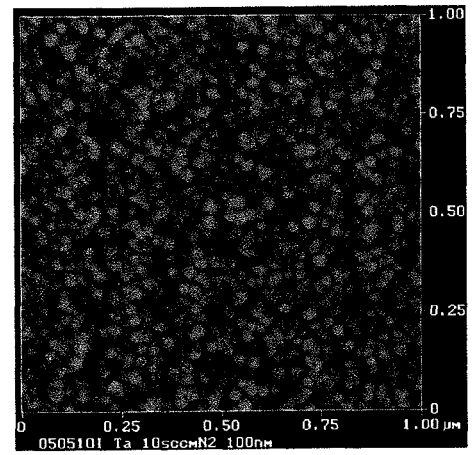

FIG. 4 is a graph showing the relationship between the nitrogen (N) content of a film formed of TaN and the surface roughness thereof and FIGS. 5A to 5D are AFM (atomic force microscope) images of surfaces of films formed of tantalum nitrides (TaN) with different nitrogen contents.

Herein, TaN films with different N contents each having a thickness of 100 nm were respectively formed on transparent substrates made of synthetic quartz and then the surface roughness Rq in a 1 μm square area (number of measurement data: 256 points×256 points) was measured by NonoScope III (manufactured by Digital Instrument Corporation). As is clear from the results shown in FIG. 4 and FIGS. 5A to 5D, when the N content in the film is 62 at %, the surface roughness Rq is largely degraded to as high as 1.46 nm. The surface roughness Rq affects the line edge roughness (LER) of a pattern side wall when a transfer pattern is formed in the light-shielding layer 12. Taking them into account, it is necessary that the N content of the light-shielding layer 12 containing Ta and N be set to less than 62 at %.

Further, the surface roughness of the light-shielding layer 12 largely effects the surface roughness of the front-surface antireflection layer 13 formed thereon and thus affects the surface roughness of the entire light-shielding film 19. The surface roughness of the light-shielding film 19 affects a foreign matter/defect inspection using a defect inspection apparatus. In the inspection for this invention, M1350 (manufactured by Lasertec Corporation) was used as a defect inspection apparatus. It has been confirmed that when a foreign matter/defect inspection is performed using a light-shielding film with a surface roughness Rq of as large as 0.84 nm, even a normal portion with no foreign matter is erroneously detected as a defect. The surface roughness of the light-shielding film 19 is reduced to a degree as compared with the surface roughness of the light-shielding layer 12 because of the formation of the front-surface antireflection layer 13 on the light-shielding layer 12. Nevertheless, for adaptation to various defect inspection apparatuses, the surface roughness Rq of the light-shielding layer 12 is preferably set to less than 0.84 nm. Also taking this into account, it is necessary that the N content of the light-shielding layer 12 containing Ta and N be set to Seat % or less.

When the light-shielding layer 12 is formed in contact with the transparent substrate 11, it is necessary to suppress back-surface reflection using the light-shielding layer 12. The back-surface reflectance for ArF exposure light required for a transfer mask should be set to less than 40% and is preferably set to 35% or less and more preferably to 30% or less for adaptation even to an exposure apparatus with no correction function. For setting the back-surface reflectance of the light-shielding film 19 to less than 40%, the N content of the light-shielding layer 12 should be set to 7 at % or more. For setting it to 35% or less, the N content of the light-shielding layer 12 should be set to 16 at % or more. For setting it to 30% or less, the N content of the light-shielding layer 12 should be set to 34 at % or more. The light-shielding layer 12 may contain boron (B) and carbon (C) for improving the smoothness thereof. However, since these elements tend to reduce the etching rate of the light-shielding layer 12 in Cl-based dry etching and the optical density thereof, the total content thereof is preferably set to 20 at % or less. Further, the optical density of the light-shielding layer 12 is largely reduced if oxygen is contained and, therefore, oxygen is preferably not contained. Even if oxygen is contained, the oxygen content should be set to less than 10 at % and is preferably set to Sat % or less.

As the thickness of the light-shielding film 19 increases, a bias due to the electromagnetic field (EMF) effect becomes larger. The EMF bias largely affects the CD accuracy of the transfer pattern line width of a resist on a wafer. Therefore, a simulation of the EMF effect is carried out, thereby performing correction of a transfer pattern of a transfer mask for reducing the influence due to the EMF bias. However, there is a problem that as the thickness increases, a more complicated simulation is required to cause a larger load. Taking into account a reduction in thickness of the resist film, the thickness of the light-shielding film 19 should be set to less than 65 nm. Further, taking into account also a reduction in simulation load due to the EMF effect, the thickness of the light-shielding film 19 is preferably set to 60 nm or less.

The front-surface antireflection layer 13 is required to have high resistance to a Cl-based gas which is used in dry etching of the light-shielding layer 12, and thus contains Si. From this point of view, the ratio derived by dividing the content of Si in the front-surface antireflection layer 13 by the total content of Ta and Si in the front-surface antireflection layer 13 (i.e. the ratio, given in at %, of the Si content when the total content of Ta and Si in the layer is given as 100; hereinafter referred to as "(Si/Ta+Si) ratio") should be set to Sat % or more and is preferably set to 10 at % or more and more preferably to 15 at % or more. The upper limit of the (Si/Ta+Si) ratio is preferably 90 at % or less, more preferably 82 at % or less, and further preferably 70 at % or less. Since the front-surface antireflection layer 13 should serve to reduce the front-surface reflectance of the light-shielding film 19 for exposure light, it is necessary that the front-surface antireflection layer 13 contain oxygen or nitrogen or both of them. As compared with a film containing Si and oxygen and/or nitrogen, a film containing Ta and oxygen and/or nitrogen can increase the refractive index for ultraviolet light and, therefore, by adjusting the (Si/Ta+Si) ratio, it is possible to achieve both a desired low reflection and a reduction in thickness of the front-surface antireflection layer 13.

Oxygen is larger than nitrogen in the decreasing degree of an extinction coefficient relative to its content in a layer and thus can more increase the transmittance of an upper layer for exposure light, so that it is possible to more reduce the front-surface reflectance. Accordingly, the oxygen content in the front-surface antireflection layer 13 is preferably 10 at % or more. More preferably, if it is 15 at % or more, it is possible to achieve a further reduction in front-surface reflectance and, if it is 20 at % or more, it is possible to further enhance the interference effect and to achieve a certain low reflection.

Nitrogen is smaller than oxygen in the decreasing degree of an extinction coefficient relative to its content in a layer and thus less contributes to a reduction in front-surface reflectance. On the other hand, nitrogen also has a property that the decreasing degree of the optical density of the front-surface antireflection layer 13 relative to its content is smaller as compared with oxygen. Therefore, it is possible to relax the restriction of the optical density required for the light-shielding layer 12 and thus to contribute to a reduction in thickness of the light-shielding layer 12. Taking into account both the reduction in front-surface reflectance and the reduction in thickness of the light-shielding layer 12, it is preferable that nitrogen be contained. In this case, the nitrogen content in the front-surface antireflection layer 13 is preferably 10 at % or more. More preferably, if it is 15 at % or more, it is possible to achieve a further reduction in front-surface reflectance and, if it is 20 at % or more, it is possible to achieve a low reflection even if the oxygen content in the front-surface antireflection layer 13 is suppressed.

If the total content of oxygen and nitrogen in the front-surface antireflection layer 13 is too high, the physical resistance to plasma in Cl-based dry etching is reduced. Taking this into account, the total content of oxygen and nitrogen in the front-surface antireflection layer 13 should be set to 70 at % or less. Preferably, if it is set to 65 at % or less, high resistance can be obtained and, if it is set to 60 at % or less, the resistance can be significantly enhanced.

The front-surface antireflection layer 13 may contain boron (B) and carbon (C) for improving the smoothness thereof. However, since these elements tend to increase the refractive index and the extinction coefficient of the front-surface antireflection layer 13 and thus to increase the front-surface reflectance thereof, the total content thereof is preferably set to 20 at % or less.

Since the light-shielding layer 12 underlying the front-surface antireflection layer 13 is made of the material with a higher reflectance for exposure light, the thickness of the front-surface antireflection layer 13 is required to be 5 nm or more and is preferably 7 nm or more for achieving a lower front-surface reflectance. Further, as described above, taking into account that the thickness of the light-shielding film 19 should be set to less than 65 nm in terms of the reduction in thickness of the resist film, the upper limit of the thickness of the front-surface antireflection layer 13 is preferably set to 20 nm or less. Further, taking into account that the thickness of the light-shielding film 19 is preferably set to 60 nm or less in terms of the reduction in simulation load due to the EMF effect, the upper limit of the thickness of the front-surface antireflection layer 13 is preferably set to 15 nm or less.

The front-surface antireflection layer 13 is made of the material containing tantalum and silicon and further containing one or more elements selected from oxygen and nitrogen, wherein only tantalum is a material with high conductivity. When forming the front-surface antireflection layer 13 using a mixed target of tantalum and silicon by DC sputtering of which the film forming rate is high, abnormal discharge tends to occur, resulting in high defect rate of the front-surface antireflection layer 13. Taking this into account, the front-surface antireflection layer 13 is preferably formed by high-frequency (RF) sputtering that is capable of forming a film with a low defect density even using a low-conductive target although there is a disadvantage that the film forming rate is low. In this case, it is preferable to use a mixed sintered target containing one or more substances selected from tantalum oxide and tantalum nitride and one or more substances selected from silicon oxide and silicon nitride, wherein all the substances are oxidized or nitrided in advance.

There are several methods for forming a film containing tantalum and silicon by DC magnetron sputtering. In terms of ensuring the conductivity of a target itself, use is often made of a target obtained by mixing and sintering tantalum powder and silicon powder. In the case of a thin film for use in forming a mask blank, it often has an oxidized or nitrided composition for reducing the reflectance for exposure light and improving the chemical resistance and the hot water resistance. In this case, using a mixed sintered target of tantalum and silicon, a film is formed by DC magnetron sputtering in an atmosphere of a gas, i.e. a sputtering gas, in which oxygen or nitrogen is added to a noble gas such as argon. In this event, if the difference in affinity for oxygen (nitrogen) is large between tantalum and silicon in the target, a phenomenon occurs in which atoms (tantalum) with a higher affinity in the target are selectively oxidized (nitrided) and formed into a film on a transparent substrate. Accordingly, even if an attempt is made to form a thin film having a uniform composition from its bottom to top, the film has a gradient composition in which the content of atoms easily oxidized (nitrided) is high on the lower side while the content of atoms not easily oxidized (nitrided) is high on the upper side.

Particularly when highly conductive tantalum is the atoms that are easily oxidized (nitrided), tantalum selectively goes out of the target so that the conductivity of the target gradually decreases, thus resulting in unstable film formation. Further, when forming a thin film containing tantalum, which is easily oxidized in the atmosphere, of a target and oxygen, tantalum oxide adheres to a target surface and causes abnormal discharge so that particles are produced.

In order to solve this problem, use may be made of a mixed sintered target containing an oxide (nitride) of tantalum and an oxide (nitride) of silicon. This makes it possible to suppress selective oxidation (nitridation) of one of the transition metal and silicon during film formation. However, it is difficult to ensure the conductivity of such a target. Taking this into account, use is made of high-frequency (RF) sputtering which does not require consideration of the conductivity of a target although the film forming rate is low. With such a manufacturing method, even in the case where a thin film is formed using a mixed sintered target of tantalum and silicon having a large difference in tendency to be oxidized or nitrided and using a sputtering gas added with oxygen or nitrogen, it is possible to reduce the occurrence of unwanted composition gradient, film formation instability, and particles. In this case, if the transition metal and silicon in the target are oxidized (nitrided) to some extent in advance, it is possible to suppress selective oxidation (nitridation) of either of the elements, which is thus effective. In this event, the difference between the composition (oxygen content or nitrogen content) of the thin film to be formed and the oxygen content or the nitrogen content in the target can be adjusted using, as the sputtering gas, a gas in which oxygen or nitrogen is properly added to a noble gas. As the noble gas for the sputtering gas, use can be made of argon, krypton, xenon, radon, or the like. Among them, argon is optimal.

In the above-mentioned manufacturing method using high-frequency sputtering, it is preferable to use only a noble gas as a sputtering gas when forming a thin film. In this case, the oxygen content and/or the nitrogen content of an entire mixed sintered target are/is adjusted to be approximately equal to the oxygen content and/or the nitrogen content of a thin film to be formed. This makes it possible to further improve the uniformity of the composition of the thin film. In the case of incorporating oxygen and/or nitrogen into a thin film by adding oxygen and/or nitrogen to a sputtering gas, it is complicated to determine film forming conditions that can achieve the required composition of the thin film. This, however, can be significantly simplified by the above-mentioned adjustment of the oxygen content and/or the nitrogen content between the mixed sintered target and the thin film to be formed.

The above-mentioned manufacturing method using high-frequency sputtering can obtain a particularly great effect in the case of an oxide, nitride, or oxynitride film containing tantalum and silicon. This is because, among transition metals, tantalum is particularly easily oxidized. When forming a thin film containing oxygen by DC magnetron sputtering, tantalum in a target tends to be selectively oxidized, thereby causing particularly the problem of composition gradient, the problem of film formation instability, and the problem of particles. Accordingly, in this case, the above-mentioned manufacturing method functions particularly effectively.

A mixed sintered target for use in the above-mentioned manufacturing method may be configured to contain one or more substances selected from $Ta_2O_5$ and TaN and one or more substances selected from $SiO_2$ and $Si_3N_4$. Since $Ta_2O_5$, TaN, $SiO_2$, and $Si_3N_4$ are each in a stoichiometrically stable state, a thin film formed using this target has very high uniformity of composition. According to the oxygen content and/or the nitrogen content of a thin film to be formed, the ratio of the substances to be mixed for a target is properly adjusted. For example, in the case of a film containing Ta, Si, and O, use may be made of a mixed sintered target of $Ta_2O_5$ and $SiO_2$. In the case of a film containing Ta, Si, and N, use may be made of a mixed sintered target of TaN and $Si_3N_4$. Further, in the case of a film containing Ta, Si, O, and N, a mixed sintered target may be produced by adjusting the mixing ratio of $Ta_2O_5$, TaN, $SiO_2$, and $Si_3N_4$ so that the required oxygen content and the required nitrogen content are obtained.

In the case of forming a thin film containing tantalum, silicon, and oxygen, if a mixed sintered target comprises $Ta_2O_5$ and $SiO_2$ and the mol % mixing ratio of $Ta_2O_5$ and $SiO_2$ is 10:90 to 90:10, the effect is more significant. If the mol % mixing ratio of $Ta_2O_5$ and $SiO_2$ is 20:80 to 70:30, the effect is further significant.

In this invention, as a Cl-based gas for use in cl-based dry etching, use may be made of, for example, $Cl_2$, $SiCl_4$, HCl, $CCl_4$, $CHCl_3$, $BCl_3$, or the like. As an F-based gas for use in F-based dry etching, use may be made of, for example, $SF_6$, $CF_4$, $C_2F_6$, $CHF_3$, or the like and it is also possible to use a mixed gas of one of them and He, $H_2$, $N_2$, Ar, $C_2H_4$, or the like.

In this invention, a resist is preferably a chemically amplified resist for electron beam writing. This is because it is suitable for high-accuracy processing.

This invention is applied to an electron-beam-writing mask blank adapted to be formed with a resist pattern by electron beam writing.

In this invention, as a substrate, use may be made of a synthetic quartz substrate, a $CaF_2$ substrate, a soda-lime glass substrate, an alkali-free glass substrate, a low thermal expansion glass substrate, an aluminosilicate glass substrate, or the like.

In this invention, a mask blank may be a mask blank before a resist film is coated, or a mask blank coated with a resist film.

In this invention, a transfer mask may be a binary mask that does not use a phase shift effect, or a reticle.

Now, mask blanks and transfer masks of this invention will be described using Examples and Comparative Examples. A transfer mask manufacturing method will be described with reference to FIGS. 3A to 3G.

EXAMPLE 1

Figure 3A:
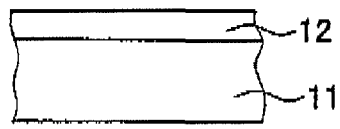
FIGS. 3A to 3G are schematic sectional views showing the manufacturing process of the transfer mask according to the embodiment of this invention.

As shown in FIG. 3A, there was prepared a substrate 11 with precision-polished main surfaces, made of synthetic quartz and having an about 152 mm×152 mm square size with a thickness of about 6.35 mm. Then, the substrate 11 was placed in a single-wafer DC sputtering apparatus. Using a Ta target, a light-shielding layer 12 of TaN (composition ratio Ta: 84.0 at %, N: 16.0 at %) was formed to a thickness of 43 nm by DC magnetron sputtering in a mixed gas atmosphere of xenon (Xe) and nitrogen (N).

Figure 3B:
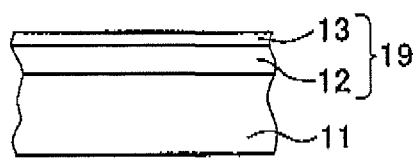

Then, as shown in FIG. 3B, the substrate 11 formed with the light-shielding layer 12 was placed in a single-wafer RF sputtering apparatus where, using a TaSiO mixed sintered target, a front-surface antireflection layer 13 of TaSiO (composition ratio Ta: 27.4 at %, Si: 5.9 at %, O: 66.7 at %) was formed to a thickness of 12 nm on the light-shielding layer 12 by RF magnetron sputtering in an argon (Ar) gas atmosphere. In this manner, an ArF-exposure binary mask blank was manufactured. The elements of the layers 12 and 13 of a light-shielding film 19 were analyzed by the Rutherford backscattering spectrometry (RBS), which shall also apply to later-described Examples and Comparative Examples. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.29 nm.

Figure 3C:
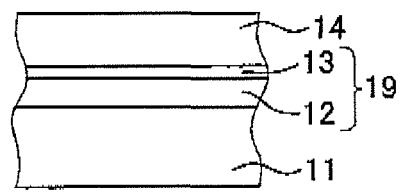
Figure 3D:
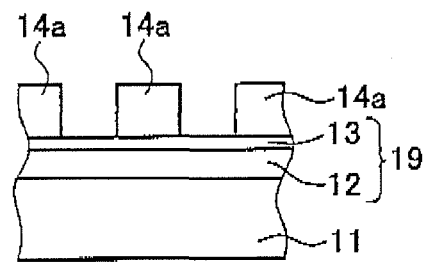

Then, as shown in FIGS. 3C and 3D, a chemically amplified positive resist 14 for electron beam writing (exposure) (PRL009: manufactured by FUJIFILM Electronic Materials Co., Ltd.) was coated to a thickness of 150 nm on the front-surface antireflection layer 13 of the light-shielding film 19 and then a transfer pattern of the DRAM hp32 nm generation was exposed by electron beam writing and developed, thereby forming a resist pattern 14a.

Figure 3E:
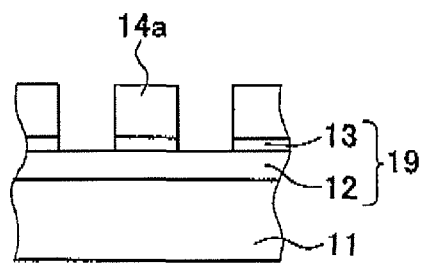

Then, as shown in FIG. 3E, a pattern of the front-surface antireflection layer 13 was formed by dry etching using a fluorine-based ($CHF_3$) gas.

Figure 3F:
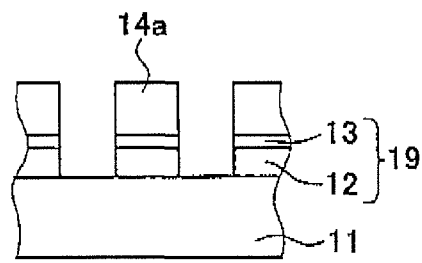

Then, as shown in FIG. 3F, a pattern of the light-shielding layer 12 was formed by dry etching using a chlorine-based ($Cl_2$) gas.

Figure 3G:
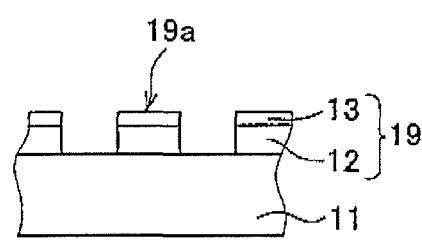

Then, as shown in FIG. 3G, the resist pattern 14a on the pattern of the front-surface antireflection layer 13 was removed, thereby obtaining an ArF-exposure binary transfer mask having a light-shielding film pattern 19a.

With respect to the obtained transfer mask, the optical properties were measured by a spectrophotometer (Solid-Spec-3700DUV: manufactured by Shimadzu Corporation). As a result, the optical density of the light-shielding film 10 was 3.0 and thus the light-shielding performance was sufficient for a binary transfer mask. Further, the front-surface reflectance and the back-surface reflectance of the light-shielding film 19 for ArF exposure light were 15.9% and 34.9%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation. With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 2

Next, a mask blank according to Example 2 will be described.

The mask blank according to this Example was manufactured in the same manner as in Example 1 except that a front-surface antireflection layer 13 of a light-shielding film 19 was formed as a TaSiO film (composition ratio Ta: 23.3 at %, Si: 11.7 at %, O: 65 at %) having a thickness of 16 nm. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.32 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 8.4% and 34.8%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 3

Next, a mask blank according to Example 3 will be described.

The mask blank according to this Example was manufactured in the same manner as in Example 1 except that a front-surface antireflection layer 13 of a light-shielding film 19 was formed as a TaSiO film (composition ratio Ta: 30.1 at %, Si: 1.7 at %, O: 68.2 at %) having a thickness of 10 nm. The optical density (OD) of the light-shielding film 19 for the wavelength of ArF excimer laser exposure light was 3.0. Further, with respect to the obtained mask blank, the surface roughness Rq in a 1 µM square area (number of measurement data: 256 points×256 points) on a surface of the light-shielding film 19 was measured by NonoScope III (manufactured by Digital Instrument Corporation). As a result, the surface roughness Rq was 0.34 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 22.1% and 34.8%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 4

Next, a mask blank according to Example 4 will be described.

The mask blank according to this Example was manufactured in the same manner as in Example 1 except that a front-surface antireflection layer 13 of a light-shielding film 19 was formed as a TaSiO film (composition ratio Ta: 7.0 at %, Si: 31.4 at %, O: 61.6 at %) having a thickness of 20 nm.

The optical density (OD) of the light-shielding film 19 for the wavelength of ArF excimer laser exposure light was 3.0. Further, with respect to the obtained mask blank, the surface roughness Rq in a 1 µm square area (number of measurement data: 256 points×256 points) on a surface of the light-shielding film 19 was measured by NonoScope III (manufactured by Digital Instrument Corporation). As a result, the surface roughness Rq was 0.38 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 6.8% and 34.8%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 5

Next, a mask blank according to Example 5 will be described.

The mask blank according to this Example was manufactured in the same manner as in Example 1 except that a light-shielding layer 12 of a light-shielding film 19 was formed as a TaN film (composition ratio Ta: 68.0 at %, N: 32.0 at %) having a thickness of 45 nm. The optical density (OD) of the light-shielding film 19 for the wavelength of ArF excimer laser exposure light was 3.0. Further, with respect to the obtained mask blank, the surface roughness Rq in a 1 µm square area (number of measurement data: 256 points×256 points) on a surface of the light-shielding film 19 was measured by NonoScope III (manufactured by Digital Instrument Corporation). As a result, the surface roughness Rq was 0.28 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 17.6% and 30.4%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 6

Next, a mask blank according to Example 6 will be described.

The mask blank according to this Example was manufactured in the same manner as in Example 1 except that a light-shielding layer 12 of a light-shielding film 19 was formed as a TaN film (composition ratio Ta: 49.0 at %, N: 51.0 at %) having a thickness of 47 nm. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.31 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 16.5% and 26.4%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 7

Next, a mask blank according to Example 7 will be described.

The mask blank according to this Example was manufactured in the same manner as in Example 1 except that a light-shielding layer 12 of a light-shielding film 19 was formed as a TaN film (composition ratio Ta: 93.0 at %, N: 7.0 at %) having a thickness of 40 nm. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.48 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 11.8% and 39.9%, respectively, which are values that do not affect pattern transfer. TEM observation was carried out for the light-shielding film pattern 19a at an edge portion of the front-surface antireflection layer 13. As a result, rounding of the edge portion was not observed and it was also confirmed that the line edge roughness (LER) of the light-shielding film pattern 19a had sufficient accuracy for a transfer mask for use in the DRAM hp32 nm generation.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

EXAMPLE 8

Next, a mask blank according to Example 8 will be described. FIG. 1 shows a schematic sectional view of a binary mask blank according to Example 8.

A manufacturing method of the mask blank according to Example 8 comprises a step of forming a light-shielding layer 12 composed mainly of TaN on a transparent substrate 11 and a step of forming, on the light-shielding layer 12, a front-surface antireflection layer 13 composed mainly of TaSiO by high-frequency (RF) sputtering using a mixed sintered target comprising $Ta_2O_5$ and $SiO_2$ as a sputtering target and using argon (Ar) as a sputtering gas. The light-shielding layer 12 and the front-surface antireflection layer 13 jointly form a light-shielding film 19 in the mask blank.

The transparent substrate 11 has precision-polished main surfaces and is made of synthetic quartz having an about 152 mm×152 mm square size with a thickness of about 6.35 mm.

As the light-shielding layer 12, a TaN layer (composition ratio Ta: 84.0 at %, N: 16.0 at %) was formed to a thickness of 43 nm by DC magnetron sputtering using Ta as a target and introducing a mixed gas of Xe and $N_2$ as a sputtering gas. The nitrogen content of the TaN layer should be 7 at % or more. By this, the reflectance (back-surface reflectance) on a surface, where the light-shielding layer 12 is not formed, of the substrate 11 can be set to less than 40%.

Then, the substrate 11 formed with the light-shielding layer 12 was placed in a single-wafer RF sputtering apparatus where, using a mixed sintered target comprising $Ta_2O_5$ and $SiO_2$, the front-surface antireflection layer 13 of TaSi(O) (composition ratio Ta: 22.7 at %, Si: 9.9 at %, O: 67.4 at %) was formed to a thickness of 15 nm on the light-shielding layer 12 by RF magnetron sputtering in an argon (Ar) gas atmosphere. The mixed sintered target comprising $Ta_2O_6$ and $SiO_2$ was produced by mixing and sintering $Ta_2O_5$ powder and $SiO_2$ powder at a mixing ratio (mol % ratio) of 70:30. In this manner, an ArF-exposure binary mask blank was manufactured.

The front-surface antireflection layer 13 was formed with an approximately uniform composition ratio from its interface side (bottom side) adjacent to the light-shielding layer 12 to the outermost surface side (top side) of the light-shielding film 19. A foreign matter/defect inspection for the light-shielding film 19 was conducted using M1350 (manufactured by Lasertec Corporation) as a defect inspection apparatus and it was confirmed that the defect density was very low.

Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.29 nm.

In Example 8, the xenon (Xe) gas was used as the sputtering gas in the formation of the light-shielding layer 12 of TaN. This is because the film stress can be significantly reduced. When the film stress is adjusted by a different method, another inert gas such as argon (Ar) or krypton (Kr) may be used.

Next, a description will be given of a method of manufacturing an ArF-exposure transfer mask using the manufactured mask blank. FIGS. 3A to 3G show the manufacturing process of the transfer mask.

As shown in FIGS. 3C and 3D, a chemically amplified positive resist 14 for electron beam writing (PRL009: manufactured by FUJIFILM Electronic Materials Co., Ltd.) was coated to a thickness of 150 nm on the front-surface antireflection layer 13 of TaSiO and then electron beam writing and development were carried out, thereby forming a resist pattern 14a.

Then, as shown in FIG. 3E, using the resist pattern 14a as a mask, a pattern of the front-surface antireflection layer 13 was formed by dry etching using a fluorine-based (CHF$_3$) gas.

Then, as shown in FIG. 3F, using the resist pattern 14a and the pattern of the front-surface antireflection layer 13 as a mask, a pattern of the light-shielding layer 12 was formed by dry etching using a chlorine-based (Cl$_2$) gas. Further, 30% additional etching was carried out, thereby forming a pattern 19a of the light-shielding film 19 on the substrate 11. Cross-sectional SEM observation was carried out for the light-shielding film pattern 19a thus obtained. As a result, the resist pattern 14a remained with a thickness of about 80 nm.

Finally, as shown in FIG. 3G, the resist pattern 14a on the light-shielding film pattern 19a was removed, thereby completing an ArF-exposure binary transfer mask.

With respect to the obtained transfer mask, the optical properties were measured by a spectrophotometer (Solid-Spec-3700DUV: manufactured by Shimadzu Corporation). As a result, the optical density of the light-shielding film 19 was 3.0 or more and thus the light-shielding performance was sufficient for a binary transfer mask. Further, the front-surface reflectance and the back-surface reflectance of the light-shielding film 19 for ArF exposure light were 20% or less and less than 40%, respectively.

COMPARATIVE EXAMPLE 1

Next, a mask blank according to Comparative Example 1 will be described.

The mask blank according to this Comparative Example was manufactured in the same manner as in Example 1 except that a front-surface antireflection layer 13 of a light-shielding film 19 was formed as a TaO film (composition ratio Ta: 31.6 at %, O: 68.4 at %) having a thickness of 9 nm. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.31 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 25.2% and 36.1%, respectively, which are values that do not affect pattern transfer. However, the front-surface reflectance exceeded 25%. TEM observation was carried out for the light-shielding film pattern 19a at an edge portion of the front-surface antireflection layer 13. As a result, rounding of the edge portion was observed and it was also confirmed that the line edge roughness (LER) of the light-shielding film pattern 19a did not satisfy the accuracy required for a transfer mask for use in the DRAM hp32 nm generation. It is conjectured that because of the fact that Si was not contained in the front-surface antireflection layer 13 and that the oxidation degree was increased for reducing the front-surface reflectance, the resistance to Cl-based dry etching became insufficient.

With respect to the mask blank before manufacturing the transfer mask, a foreign matter/defect inspection was conducted using M1350 (manufactured by Lasertec Corporation) as a defect inspection apparatus and it was confirmed that it was possible to identify defects normally.

COMPARATIVE EXAMPLE 2

Next, a mask blank according to Comparative Example 2 will be described.

The mask blank according to this Comparative Example was manufactured in the same manner as in Example 1 except that a light-shielding layer 12 of a light-shielding film 19 was formed as a Ta film (composition ratio Ta: 100 at %) having a thickness of 39 nm. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by Nono-Scope III (manufactured by Digital Instrument Corporation). As a result, the surface roughness Rq was 0.55 nm.

Then, an ArF-exposure binary transfer mask having a light-shielding film pattern 19a was manufactured by the same process as in Example 1. With respect to the obtained transfer mask, the optical properties were measured by a spectrophotometer (SolidSpec-3700DUV: manufactured by Shimadzu Corporation). As a result, the optical density of the light-shielding film 19 was 3.0 and thus the light-shielding performance was sufficient for a binary transfer mask. Further, the front-surface reflectance and the back-surface reflectance of the light-shielding film 19 for ArF exposure light were 10.4% and 44.6%, respectively. The back-surface reflectance was high so that there was a problem in pattern transfer. When the transfer mask was left in the atmosphere, an edge surface of the light-shielding film pattern 19a at the light-shielding layer 12 started to be oxidized so that the pattern line width was changed to cause a problem in CD accuracy.

COMPARATIVE EXAMPLE 3

Next, a mask blank according to Comparative Example 3 will be described.

The mask blank according to this Comparative Example was manufactured in the same manner as in Example 1 except that a light-shielding layer 12 of a light-shielding film 19 was formed as a TaN film (composition ratio Ta: 38.0 at %, N: 62.0 at %) having a thickness of 52 nm. The optical density (OD) of the light-shielding film 19 for the wavelength of ArF excimer laser exposure light was 3.0. Further, with respect to the obtained mask blank, the surface roughness Rq in a 1 μm square area (number of measurement data: 256 points×256 points) on a surface of the light-shielding film 19 was measured by NonoScope III (manufactured by Digital Instrument Corporation). As a result, the surface roughness Rq was 0.86 nm. With respect to this mask blank, a foreign matter/defect inspection was conducted using M1350 (manufactured by Lasertec Corporation) as a defect inspection apparatus. As a result, small-size defects were detected over the entire surface of the light-shielding film 19. Inspection images were visually examined for these defects. As a result, there was actually no foreign matter or pinhole and these defects were found to be false defects due to the surface roughness. It was confirmed that the mask blank was an example with a problem in foreign matter/defect inspection.

In each of the above-mentioned Examples, TaSiO was used as the front-surface antireflection layer 13. Tests were performed using TaSiON instead of TaSiO by properly adjusting the layer composition and thickness in the same manner as in the above-mentioned Examples. As a result, it was confirmed that it was possible to manufacture a transfer mask having high resistance to dry etching with a Cl-based gas and having sufficient accuracy of the line edge roughness (LER) of a light-shielding film pattern 19a even for use in the DRAM hp32 nm generation and that even if the total thickness of a light-shielding film 19 was less than 65 nm or further 60 nm or less, it was possible to adjust the front-surface reflectance to as low as 15% or less or 10% or less.

A transfer mask according to this invention can be used, for example, as a transfer mask for forming a fine pattern by photolithography in the semiconductor manufacturing process. A mask blank according to this invention can be used as a mask blank as an intermediate product that can be formed into a transfer mask by applying certain treatments thereto.

While this invention has been described with reference to the embodiment and Examples, the technical scope of the invention is not limited to the scope of the description of the above-mentioned embodiment and Examples. It is obvious to a person skilled in the art that various changes or improvements can be added to the above-mentioned embodiment and Examples. It is clear from the description of claims that the modes added with such changes or improvements can also be included in the technical scope of this invention.

What is claimed is:

1. A mask blank for producing a transfer mask adapted to ArF excimer laser exposure light, comprising:
   a transparent substrate, and
   a light-shielding film on the transparent substrate,
   wherein the light-shielding film has a structure in which a light-shielding layer and a front-surface antireflection layer are laminated in this order from the transparent substrate,
   the light-shielding layer is made of a material containing tantalum and nitrogen, the material containing no silicon or containing silicon of 10 at % or less in content, and
   the front-surface antireflection layer is made of a material containing tantalum and silicon and further containing one or more elements selected from oxygen and nitrogen,
   wherein a total content of the tantalum and the silicon in the front-surface antireflection layer is given as 100, a ratio (Si/(Ta+Si)) of a content of the silicon with respect to the total content is 5% or more and 90% or less, and
   wherein the front-surface antireflection layer serves as an etching mask upon dry-etching the light-shielding layer with a chlorine-based gas substantially free of oxygen.

2. The mask blank according to claim 1, wherein a content of nitrogen in the light-shielding layer is less than 62 at %.

3. The mask blank according to claim 1, wherein a content of nitrogen in the light-shielding layer is 7 at % or more.

4. The mask blank according to claim 1, wherein the light-shielding film has a thickness of less than 65 nm.

5. The mask blank according to claim 1, wherein the front-surface antireflection layer has a thickness of 5nm or more and 20nm or less.

6. The mask blank according to claim 1, wherein the light-shielding layer or the front-surface antireflection layer contains boron.

7. A method of manufacturing the mask blank according to claim 1, comprising:
   depositing the front-surface antireflection layer by high-frequency sputtering using a mixed sintered target containing one or more substances selected from tantalum oxide and tantalum nitride, and one or more substances selected from silicon oxide and silicon nitride.

8. The method according to claim 7, wherein the mixed sintered target contains one or more substances selected from $Ta_2O_5$ and TaN, and one or more substances selected from $SiO_2$ and $Si_3N_4$.

9. The method according to claim 7, wherein the mixed sintered target comprises $Ta_2O_5$ and $SiO_2$, and a mol % mixing ratio of $Ta_2O_5$ and $SiO_2$ is 10:90 to 90:10.

10. A transfer mask wherein a transfer pattern is formed in the light-shielding film of the mask blank according to claim 1.

11. A method of manufacturing a transfer mask in which a transfer pattern is formed in the light-shielding film of the mask blank according to claim 1, comprising:
   a first step of dry-etching the front-surface antireflection layer with a fluorine-based gas substantially free of oxygen using, as a first etching mask, a resist film having the transfer pattern;
   and a second step of, after the first step, dry-etching the light-shielding layer with a chlorine-based gas substantially free of oxygen using the front-surface antireflection layer as a second etching mask.

12. The mask blank according to claim 1, wherein a content of the oxygen in the front-surface antireflection layer is 10 at % or more.

13. The mask blank according to claim 1, wherein a content of the nitrogen in the front-surface antireflection layer is 10 at % or more.

14. The mask blank according to claim 1, wherein a resist film is coated on the front-surface antireflection layer.

* * * * *